United States Patent [19]

Kuijk

[11] 4,052,748

[45] Oct. 4, 1977

[54] MAGNETORESISTIVE MAGNETIC HEAD

[75] Inventor: Karel Elbert Kuijk, Eindhoven, Netherlands

[73] Assignee: U.S. Philips Corporation, New York, N.Y.

[21] Appl. No.: 729,220

[22] Filed: Oct. 4, 1976

Related U.S. Application Data

[63] Continuation of Ser. No. 560,164, March 20, 1975, abandoned.

[30] Foreign Application Priority Data

Apr. 1, 1974 Netherlands .......................... 7404362

[51] Int. Cl.² .......................... G11B 5/30; H01C 7/16
[52] U.S. Cl. .................................. 360/113; 338/32 R; 324/46
[58] Field of Search .......................... 360/113; 324/46; 338/32 R

[56] References Cited

U.S. PATENT DOCUMENTS

| | | | |
|---|---|---|---|
| 3,493,694 | 2/1970 | Hunt | 360/113 |
| 3,814,863 | 6/1974 | O'Day et al. | 360/113 |
| 3,848,217 | 11/1974 | Lazzari | 360/113 |
| 3,860,965 | 1/1975 | Voegeli | 360/113 |
| 3,879,760 | 4/1975 | Lazzari | 360/113 |

OTHER PUBLICATIONS

IBM Technical Disclosure Bulletin, vol. 17, No. 4, Sept. 1974, pp. 967-968, Magnetorestive Read Heads, Bates et al.

Primary Examiner—Alfred H. Eddleman
Attorney, Agent, or Firm—Frank R. Trifari; Robert S. Smith

[57] ABSTRACT

A magnetic head for detecting information-representing magnetic fields on a magnetic recording medium and comprising an elongate magneto-resistive element of a magnetically anisotropic material which at its ends has contacts for connection to a current or voltage source. In order to linearize the playback characteristic of the element, the easy axis of magnetization coincides with the longitudinal direction of the element and means are present which force the current to travel at an angle of minimum 15° and maximum 75° with the longitudinal direction. These means consist in particular of equipotential strips provided on the element.

5 Claims, 4 Drawing Figures

MAGNETORESISTIVE MAGNETIC HEAD

This is a continuation of application Ser. No. 560,164, filed Mar. 20, 1975, now abandoned.

The invention relates to a magnetic head for detecting information-representing magnetic fields on a magnetic recording medium and comprising an elongate magnetoresistive element of a magnetically anisotropic material which at its ends has contacts for the connection to a current or voltage source.

Such a magnetic head is known, for example, from the U.S. Pat. No. 3,493,694.

The operation of said so-called magnetoresistive head is based on the use of a strip-shaped element of a ferromagnetic, metallic magnetically anisotropic material, for example Ni-Fe, which is arranged with one of its edges in the immediate proximity of, or in contact with, a magnetic recording medium. The field of the recording medium produces variations in the magnetisation of the element and modulates the resistance thereof via the magnetoresistance effect. This means that when the recording medium passes the head, the information-representing magnetic fields present on the medium rotate the spin system of the magnetoresistive element so that the resistance varies. In this manner the output signal of an external circuit which is connected to the element assumes the form of current or voltage fluctuations which represent the information stored in the recording medium.

Since the variation of the resistance of a magnetoresistive element under the influence of a magnetic field is quadratic, it is usual to optimize the operation in the case of analog recording by linearizing the head.

For that purpose, according to the already mentioned U.S. patent, a transverse magnetic bias field is applied through external means to an elongate element the easy axis of magnetization of which coincides with the longitudinal direction of the element. Under the influence of said field, the direction of magnetisation of the element which without a field coincides with the easy axis of magnetization is rotated through a certain angle. The strength of the bias field should be such that the direction of magnetization encloses an angle of 45° with the longitudinal direction of the element which is also the direction of current passage through the element. The drawback of the use of the transverse magnetic bias field is that the possibility exists that the information on the recording medium is erased by it, while it is difficult to adjust the strength of the field at the correct value.

It is known from the published German patent application No. 2,121,443 to linearize the magnetoresistive head by means of internal means in contrast with the above described external biassing technique. For this purpose, the easy axis of magnetization is given a fixedly adjusted angle relative to the longitudinal direction of the element (the direction of current passage) by means of a tempering process or via the magnetostrictice properties. Since the characteristic of each magnetoresistive element is different, it is very difficult to obtain the same results in all the cases in the described manner.

It is the object of the invention to provide a magnetic head of the present type which does not exhibit the above drawbacks.

For that purpose, the magnetic head according to the invention is characterized in that the easy axis coincides with the longitudinal direction of the element and that means are present which force the current to travel at an angle of minimum 15° and maximum 75° with the longitudinal direction. The angle is preferably approximately 45°.

The advantages of the magnetic head according to the invention are evident.

1. In order to realise the desired angle between the direction of current and the direction of magnetisation, no transverse magnetic bias field is necessary. Hence there are no undesired erasing effects.

2. The angle between the direction of current and the easy axis of magnetization (the direction of magnetization in the rest condition) can be fixed with with external means.

Although it is possible to enforce the desired current direction by providing slots in the element which extend at an angle relative to the longitudinal direction and alternately debouch in the upper side and in the lower side, a preferred embodiment of the magnetic head according to the invention is characterized in that at least one readily conducting equipotential strip is provided between the contacts transversely across at least one side face of the magnetoresistive element at an angle of minimum 15° and maximum 75° with the longitudinal direction thereof. The advantage is that when the element wears off during use, the good operation is not lost, which would be the case indeed in a construction with slots, while the magnetic material itself need not be changed either. Moreover the equipotential strip (however, the element preferably has a number of mutually parallel equipotential strips) can be provided via the same mask with which the current contacts are provided on the element. In a construction with slots on the contrary an extra etching step is necessary.

A further preferred embodiment of the magnetic head according to the invention is characterized in that magnetic means are present to generate a magnetic auxiliary field having a direction which coincides with the longitudinal direction of the magnetoresistive element. It proves possible to obtain an optimum linearisation with such a longitudinal auxiliary field which preferably has a strength which is of the order of magnitude of the coercive strength of the material of the magnetoresistive element. The strength of said field, however, is so small that no danger of erasing of the recording medium exists.

The invention will be described in greater detail, by way of example, with reference to the drawing.

Figure 1:
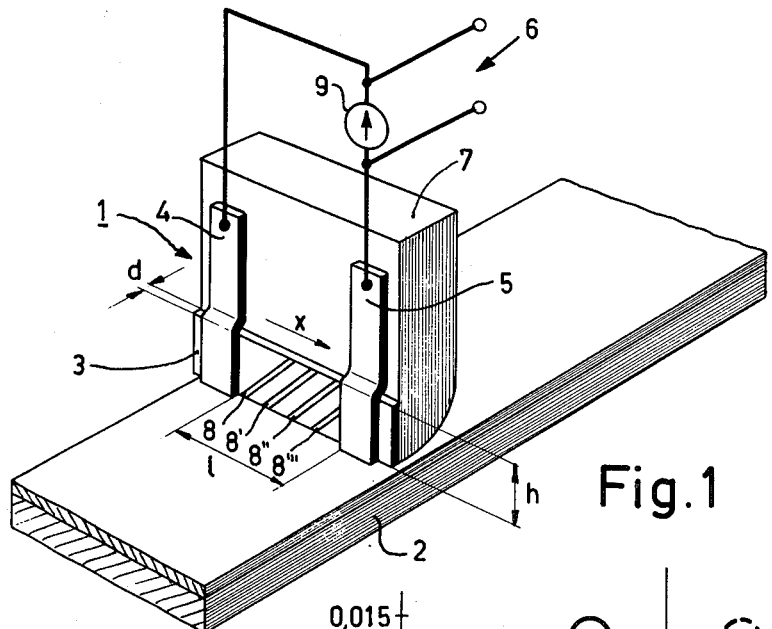
FIG. 1 is a simplified perspective view of a magnetic head according to the invention.
Figure 4:
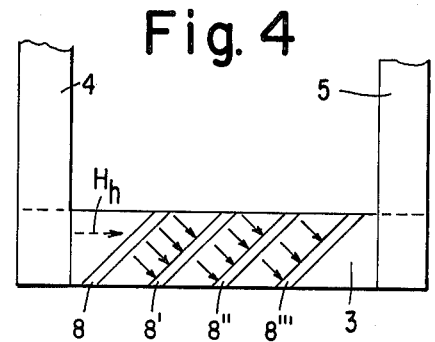
FIG. 4 is an elevational view of the magnetic head shown in FIG. 1.

FIGS. 1 and 4 show a magnetoresistive head 1 which is used in reading the information contents of a magnetic recording medium 2. The head 1 comprises a magnetoresistive element 3 which is connected to an external reading circuit 6 via conductive contacts 4 and 5. The elements 3, 4 and 5 are provided on a substrate 7, which may be glass, by means of methods used in the manufacture of integrated circuits. In a prototype of the magnetic head according to the invention the element 3 consisted of an Ni-Fe alloy having a thickness $d$ of approximately 1200, a length $l$ of 200 microns and a height $h$ of 10 microns. The contacts 4 and 5 were formed by vapour-deposited strips of gold. A number of thin gold strips 8, 8', 8'', 8''' ... having a thickness of 1 micron and a width of 5 microns were provided on the element 3 at mutual distances of 5 microns at an angle of 45°. Since gold has a 5 × lower resistivity than the Ni-Fe used and the thickness of the gold strips is approximately 10 × as large as the thickness $d$ of the magnetoresistive material, the gold strips have a 50 × better conductivity and serve as "equipotential strips" which force the current in the Ni-Fe paths between them to travel at an angle of approximately 45° with the longitudinal direction. Under the influence of an information-containing magnetic field on the recording medium 2 the resistance of each of the said intermediately located Ni-Fe paths will decrease or increase according as the direction of magnetisation coincides more or less with the current direction. This means that in principle linear recording by means of a non-biased magnetoresistive head is possible.

Figure 2:
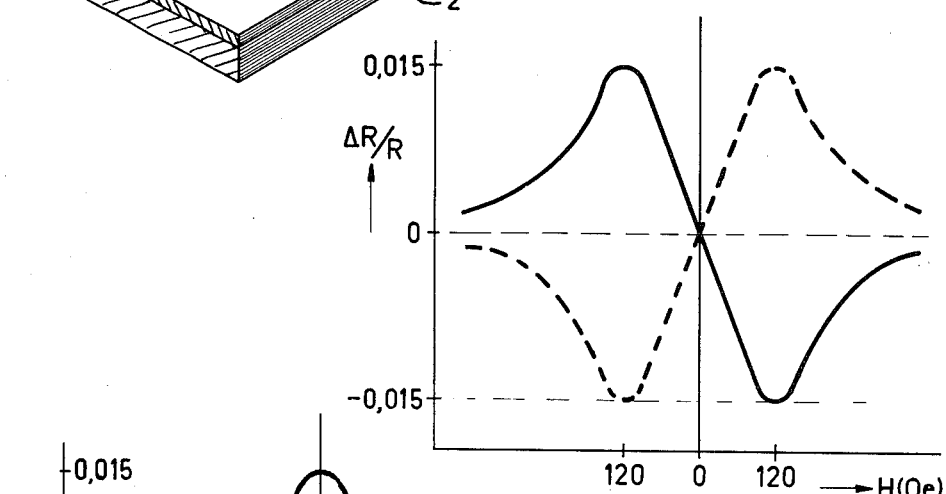
FIG. 2 is a graph showing the resistance variation R/R of the magnetoresistive element of the head shown in FIG. 1 as a function of the transverse external field H.

A longitudinal auxiliary field $H_h$ is generated by means of a magnet (not shown). The strength of this auxiliary field in the present case was 6 Oersted, which corresponds to the coercive field strength of the Ni-Fe used for the element 3 (5.9 Oersted). This field strength is so small that erasing of the information on the medium 2 need not be feared. This in contrast with the use of a transverse field for the linearisation in which field strengths of, for example, 100 Oersted are necessary. Moreover, when the head 1 is manufactured by means of methods used in the manufacture of integrated circuits, it is comparatively simple to provide the magnet for the longitudinal auxiliary field in the form of a permanent magnetic layer of the required — low — field strength which occupies little space. An elegant solution is also to manufacture the substrate 7 from a magnetic material and to magnetise it in the desired direction. In order to illustrate the results obtained with the above-described prototype, FIG. 2 shows the variation R/R of the resistance R of the element 3 under the influence of an external field H. Curve 1 represents the behaviour of the element 3 when an auxiliary field $H_h$ with a strength of 6 Oersted is applied in the $+x$ direction and curve 2 when an auxiliary field $H_h$ with a strength of 6 Oersted is applied in the $-x$ direction. The ohmic resistance of the element 3 was 20 Ohm, while a current of 5 mA was supplied by the current source 9. The linearity of the behaviour of the element in the range of field values between $-120$ Oersted and $+120$ Oersted is remarkable.

Figure 3:
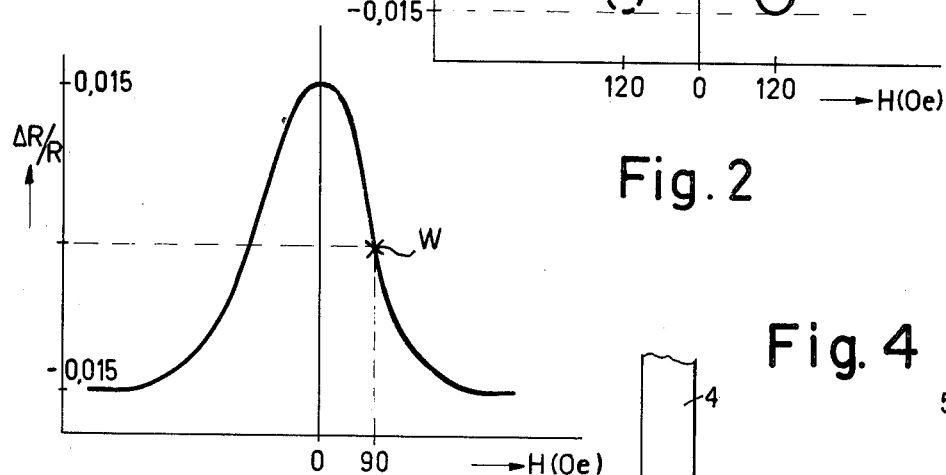
FIG. 3 is a graph showing the resistance variation R/R of a conventional magnetoresistive element.

FIG. 3 serves for comparison and the curve in said figure represents the behaviour of the element 3 prior to the provision of conductive strips. (This means that actually the behaviour of the conventional magnetoresistive element is shown). The behaviour is significantly less linear, while it furthermore appears that, in order to obtain a response which is linear as much as possible, a transverse field of approximately 90 Oersted is to be applied. (operating point W). The field is so large that influencing (erasing) of the recording medium might occur.

The longitudinal auxiliary field to be applied in the magnetic head according to the invention is considerably smaller, namely approximately equal to the strength of the coercive field of the material of the magnetoresistive element (in the present example 6 Oersted). The coercive field strength of the magnetoresistive material can be kept very small when this is not deposited direct on the substrate but on a thin intermediate layer (of, for example, 30) of chromium or titanium. Coercive field strengths of 1 Oersted can be realised in this manner. The longitudinal auxiliary field may then have a correspondingly small strength. The behaviour of the element at other field strengths of the auxiliary field was so considered. At smaller field strengths the curves started to show a slightly hysteretic behaviour while at larger field strengths the slope of the straight portion of the curve became less steep. However, the strength of the auxiliary field is not very critical since the angle between the current direction and the anisotropy axis is fixed by the geometry of the pattern of strips. This means that by means of the same mask for providing the strips a large number of magneto-resistive elements can be given the same adjustment, independently of the exact strength of the magnets to be used for generating the auxiliary field.

What is claimed is:

1. A magnetic head for detecting information representing magnetic fields on a magnetic recording medium and comprising an elongate magneto-resistive element of a magnetically anisotropic material which at its ends has contacts for the connection to a current or voltage source, the easy axis of magnetization thereof coinciding with the longitudinal axis of the element and said head further including means to force the current to travel at an angle of minimum 15° and maximum 75° with the longitudinal axis of said element said means including one readily conductive equipotential strip intermediate said current contacts in oblique relationship to said longitudinal axis.

2. A magnetic head as claimed in claim 1, characterized in that the angle is approximately 45°.

3. A magnetic head as claimed in claim 1, wherein said element has two opposite side faces extending generally in the longitudinal axis of said element and said readily conductive equipotential strip is disposed intermediate said contacts and extending transversely across at least one side face of the magnetoresistive element at an angle of minimum 15° and maximum 75° with the longitudinal axis thereof.

4. A magnetic head as claimed in claim 3, further including a number of mutually parallel equipotential strips intermediate said current contacts disposed at an angle of minimum 15° and maximum 75° with said longitudinal axis.

5. A magnetic head as claimed in claim 3, further including magnetic means to produce in said magnetoresistive element a magnetic auziliary field having direction which coincides with the longitudinal axis of the magnetoresistive element.

* * * * *